United States Patent [19]

Niemaszyk et al.

[11] 4,108,358
[45] Aug. 22, 1978

[54] PORTABLE CIRCUIT TESTER

[75] Inventors: Casimer Niemaszyk, Roselle Park, N.J.; Peter Rothenberg, West Hills, Calif.

[73] Assignee: The Bendix Corporation, Teterboro, N.J.

[21] Appl. No.: 779,978

[22] Filed: Mar. 22, 1977

[51] Int. Cl.² ............................................. G06F 11/00
[52] U.S. Cl. ............................... 235/302; 324/73 AT
[58] Field of Search ................ 235/153 AC, 153 AK, 235/302; 324/73 R, 73 AT

[56] References Cited

U.S. PATENT DOCUMENTS

| | | | |
|---|---|---|---|
| 3,657,527 | 4/1972 | Kassabgi et al. | 235/153 AC |
| 3,761,695 | 9/1973 | Eichelbarger | 235/153 AC |
| 3,924,109 | 12/1975 | Jhu et al. | 235/153 AC |
| 3,931,506 | 1/1976 | Borrelli et al. | 235/153 AC |
| 4,000,460 | 12/1976 | Kadakia et al. | 324/73 R |

OTHER PUBLICATIONS

Eric M. Ingman, Card-Programmable Digital IC Tester, Hewlett-Packard Journal, vol. 28, No. 2, pp. 11-18, Oct. 1976, pp. 11 - 19.

*Primary Examiner*—Charles E. Atkinson
*Attorney, Agent, or Firm*—Anthony F. Cuoco

[57] ABSTRACT

A portable circuit tester is disclosed which features efficient and simplified testing and fault identification of electronic units, such as circuit cards or the like. The tester incorporates an executive test program stored in a programmable read-only Memory (PROM) and accepts programmable test information related to individual units under test from PROM cards. The combination of the executive test program and a PROM card automatically applies test patterns to the unit under test and which patterns perform a go/no go acceptance test or a fault isolation test as may be desired.

7 Claims, 4 Drawing Figures

PORTABLE CIRCUIT TESTER

BACKGROUND OF THE INVENTION

1. Field of the Invention

This invention relates to electronic test apparatus and particularly to electronic test apparatus for performing functional and fault identification tests of circuit modules with more efficiency and simplicity than has heretofore been possible. More particularly, this invention relates to test apparatus of the type described which is portable, easy to use and adaptable to a variety of test purposes.

2. Description of the Prior Art

The circuit tester herein disclosed may be used for testing a variety of electronic devices. A typical application of the invention is for testing digital circuit cards. For such testing purposes, it has in the past been necessary to provide a computer controlled test station including several racks of test equipment. The programming for this equipment required the operator, either on or off line, to write a test procedure combining both system operating instructions and test data in a linear progression from first test to last test with branches on go/no go to fault diagnostic procedures, and further combining operating instructions and data. Recent adaptations of this procedure to microprocessor based systems have resulted in extensive programming requirements and hence complex and cumbersome programs requiring substantial operator training. The apparatus of the invention is structured so that the program operating routines are permanently stored internal to the apparatus, with the programmer being only required to externally program the variables of any program routine. This represents a substantial decrease in programming requirements and a simplified test procedure for a relatively untrained operator to follow.

SUMMARY OF THE INVENTION

This invention contemplates a portable circuit tester which features an interactive display system for presenting detailed step-by-step operating instructions. The device includes two internal memory units. The first such unit, which is a programmable read only memory (PROM), is dedicated for executive control functions and the second unit, which is a random access memory (RAM), is used as a scratch pad memory during test execution. Unit under test (UUT) information is stored in external PROM cards. The PROM cards have a memory capacity depending on individual unit requirements. The memory units use solid state devices so as to eliminate maintenance or reliability problems associated with disc drive and magnetic tape memory units and are of the erasable type which makes them reusable in the event that unit under test configuration is changed.

The main object of this invention is to provide a portable, compact device for functional testing and fault identification of electronic circuits.

Another object of this invention is to provide apparatus of the type described which does not require complicated test programming or substantial operator training.

Another object of this invention is to provide apparatus of the type described which internally stores program operating routines so that only variables associated with a particular unit under test need be externally programmed.

Another object of this invention is to provide apparatus of the type described which is microprocessor controlled to provide the aforenoted portability and compactness.

Another object of this invention is to provide apparatus of the type described which features an interactive display system for presenting detailed step-by-step operating instructions whereby testing can be performed by personnel without special training and/or extensive technical background.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
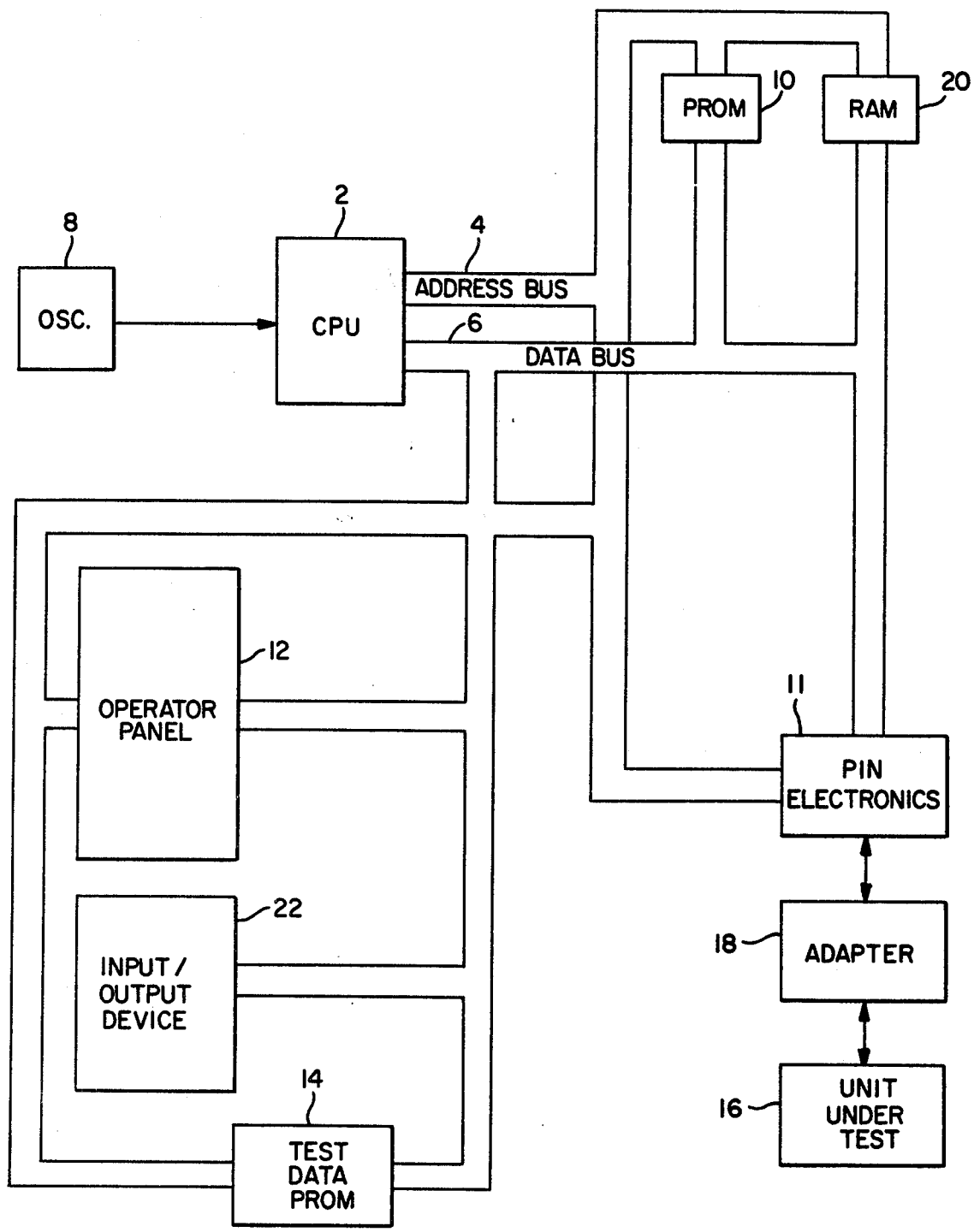
FIG. 1 is a block diagram showing generally the features of a circuit tester according to the invention.

With reference first to FIG. 1, the circuit tester herein disclosed is controlled by a central processing unit (CPU) designated by the numeral 2. CPU 2 may be an 8-BIT parallel microprocessor having six 8-BIT general purpose working registers and an accumulator. The six registers may be addressed individually or in pairs, providing single and double precision operators. Arithmetic and logic instructions set or reset four testable flags. A fifth flag provides decimal arithmetic operation.

A 16-line address bus 4 and an 8-line bidirectional data bus 6 are connected to CPU 2. The CPU is driven by an oscillator 8 which may be a 5 MHz oscillator divided to generate a two phase clock required by the CPU and for all system timing. CPU 2 executes the system program stored in the system as will be hereinafter described through an executive programmed read only memory (PROM) 10, and thereby performs required functions. These functions include display of alphanumeric information on and control of an operator panel 12, reading data from an external test data programmed read only memory (PROM) 14, routing the data to pin electronics 11 and evaluating the responses of a unit under test (UUT) 16 connected through an adapter 18 to pin electronics 11. Pin electronics 11 will be described in substantial detail with reference to FIG. 2.

Executive PROM 10 contains stored program routines for the execution of a test program utilizing data from test data PROM 14 and a system random access memory (RAM) 20. The allocated system PROM storage is 2K words while the system RAM storage is 4K words. However, the capacities of both the PROM and RAM can be easily increased to accommodate program changes as may be desired. PROM's 10 and 14 are of the ultraviolet erasable type, and hence may be erased and reused as often as necessary during the service life of the system, thereby providing flexibility without hardware modifications.

Operator panel 12 is of the type including an alphanumeric 16 character 5×7 dot matrix display with built in refresh circuitry. A 64 character repetoire is shifted from right to left across the display screen as new characters are entered until finally pushed off the end when 16 characters are achieved. Operator panel 12 also includes a panel interface which has a separate address, and controls panel lighting and power relays from the unit under test and data PROM 14. The operation of panel 12 will be more fully described with reference to FIG. 3.

Input Output device 22 may be, for purposes of illustration, a standard teletype unit. The device includes an interface which may be a standard 20 m.a. current loop.

Test data PROM 14 is a 1,024 word by 8 BIT PROM (Ultraviolet erasable as aforenoted) containing test program variable data in a format as follows:

(1) One word is representative of a "check sum" which is a number derived from CPU 12 and is an EX-CLUSIVE — OR of all the words in PROM 14. This word is used as a system validity check.

(2) Eight words are representative of the part or identification number of UUT 16 which is to be tested by test data PROM 14.

(3) Eight words are representative of the definition of pin electronics 11.

(4) One word is representative of the number of tests to be performed.

(5) One word is representative of the test number.

(6) One word is representative of the type of test to be performed. There are two types of tests. The first type of test is a "stimulus control" test. If the first BIT in the test word is "high" this is indicative that an initialization stimulus has been applied, and the next eight words represent the required output state of all the channels in pin electronics 11 which may be, for purposes of illustration, 64 channels. The remaining BITS in the word are used to define the number of pin changes following the first eight words. The following words then represent the pin number that changes. For example, if the stimulus pattern to be applied to UUT 16 is all zero and pin 12 goes "high" and "low", then the following sequence would apply:

| Hexidecimal | |
|---|---|
| 82 | (initialization with two sequences) |
| 00 | all zeros |
| 00 | |
| 00 | |
| 00 | |
| 00 | |
| 00 | |
| 00 | |
| 0C | (change pin 12) |
| 0C | (change pin 12) |

The second type of test only requires the operator to define the number of pins that change from the previous test and the numbers of the pins to be changed. This type of test is indicated by a "zero" in the first BIT of the word. Therefore, if the next test requires, for example, pins 9, 33 and 7 to change, the sequence would be written as follows:

03 Indicating not an initialization and three pin changes
09 Change pin 9
11 Change pin 33
07 Change pin 7

(7) Eight words are representative of the expected GO response pattern applied.

(8) One word is representative of the number of fault patterns which may be of three types.

(9) The fault patterns are listed in any one of three ways depending on length:
 a. Eight words representing the fault signature;
 b. The pin numbers which are different than the GO response pattern; and
 c. The pin numbers that are the same as the GO response pattern.

(10) One word is representative of the number of chips in the UUT for which a fault has been detected and which are to be replaced.

(11) One word is indicative of the particular chip or chips to be replaced.

Figure 2:
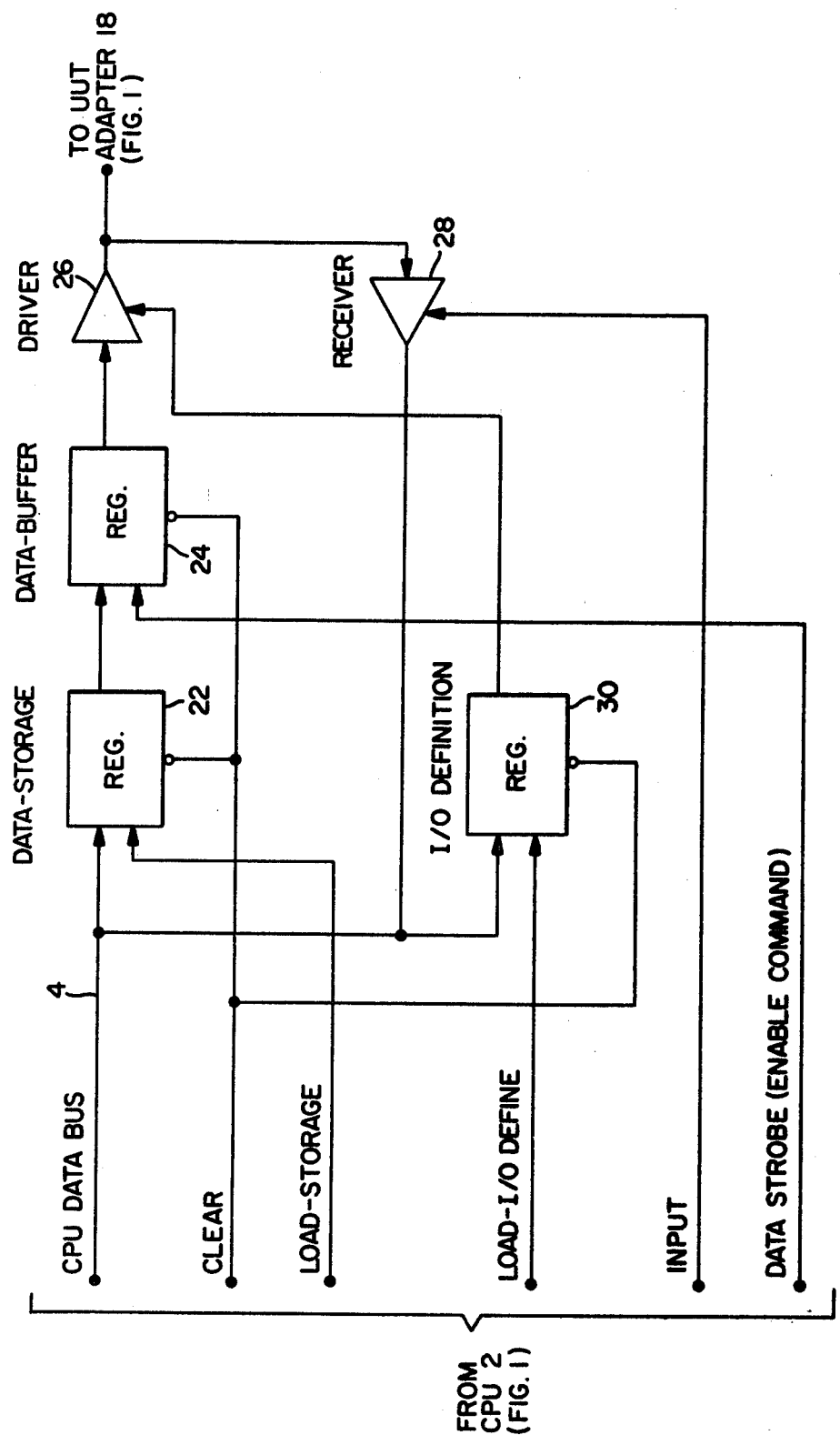
FIG. 2 is a block diagram showing in substantial detail one channel of pin electronics component 11 of the invention, which is shown generally in FIG. 1.

As heretofore noted, pin electronics 11 shown generally in FIG. 1 includes sixty-four channels. For purposes of illustration, one of the channels is shown in FIG. 2, and the description of pin electronics 11 will be with reference thereto.

As shown in the Figure, the pin electronics channel includes a dual storage register arrangement including a data storage register 22 and a data buffer register 24, as well as a tri-state TTL compatible receiver-driver arrangement including a driver logic amplifier 26 and a receiver logic amplifier 28. TTL driver amplifier 26 is programmed into a send, receive or I/O mode through an I/O definition register 30. Data storage register 22, data buffer register 24, I/O definition register 30, TTL driver amplifier 26 and TTL receiver amplifier 28 receive appropriate data, clear, load-storage, load I/O define, and data strobe (enable command) signals from CPU 2 (FIG. 1).

When all data is loaded into register 22 the data strobe (enable command) signal from CPU 2 enables transfer of the data from register 22 to register 24 and therefrom through TTL driver amplifier 26 to UTT adapter 18 (FIG. 1). Essentially, then, double buffering occurs to prevent skewing of data to UUT 16 and allows the next data pattern to be applied without disturbing the output state.

When requested by CPU 2, TTL receiver 28, separately connected to CPU data bus 4, is read eight BITS at a time. In this connection it is noted that UUT adapter 18 (FIG. 1) is a modular unit wired with the appropriate connector for UUT 16 and with the power and ground pins connected to an appropriate power supply (not shown) as will now be understood by those skilled in the art.

Figure 3:
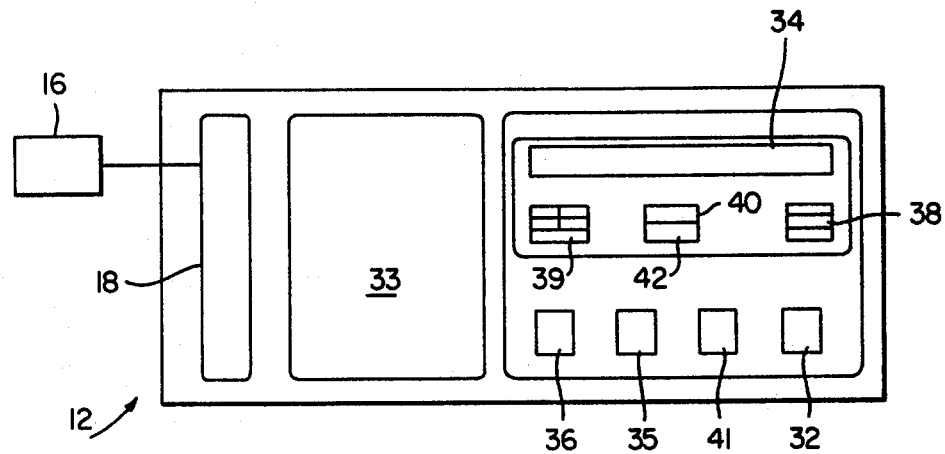
FIG. 3 is a pictorial representation illustrating operator panel 12, which is shown generally in FIG. 1, and in relation to which a typical operating procedure of the invention will be described.
Figure 4:
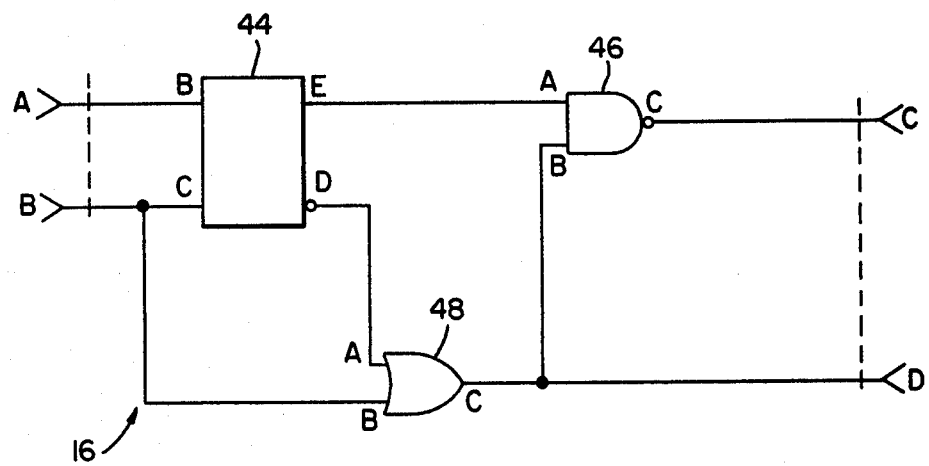
FIG. 4 is a simplified electrical schematic of a digital module such as may be tested by the device of the invention and which is shown generally in FIG. 1 as unit under test 16, and in relation to which a typical test program will be illustrated.

With reference now to FIG. 3, which is particularly illustrative of operator panel 12 shown generally in FIG. 1, the operating procedure of the device of the invention will be described.

A power button 32 is depressed by the operator whereby the device of the invention automatically conducts a self-test and displays SYSTEM READY on a display panel 34 indicating that testing may proceed. If a problem occurs at this stage a self-test diagnostic system (not shown) indicates the cause of the problem.

Upon SYSTEM READY being displayed, the operator depresses run/test button 36, whereupon display 34 informs the operator to insert a test data PROM card 14 via a PROM access door 33. Depression of button 36 after the insertion of the PROM sends power to the PROM card memory and a PROM indicator 38 illuminates.

A cycle No. button 35 is sequentially depressed to select the proper program stored in the inserted PROM card 14 for a given UUT 16. After the program is so selected, button 36 is depressed causing display panel 34 to display CONNECT UUT. UUT 16 is thereupon connected to UUT adapter 18.

After the UUT is connected, Button 36 is depressed to start the pattern testing. If the unit under test passes all the patterns in the test, a GO (test status) indicator 40 illuminates and a UUT VALID is displayed on display panel 34. If the unit under test fails a test pattern, a NO-GO (test status) indicator 42 illuminates. It will now be understood that, as an option for the programmer, test data PROM card 14 can be programmed to include fault diagnostic electronics.

A system control display 39 indicates the mode of the tester or the operator participation YES-NO status and a reset button 41 resets the tester to an initial operating state.

All programming of test data PROM card 14 is accomplished in simple test oriented language is illustrated in the following example with reference to FIG. 3. The organization of each program consists of two segments. The first segment defines the following initializing parameters:

a. unit under test (UTT) identification
 b. unit under test (UTT) configuration — Pin definition IN or OUT
 c. check sum
 d. number of test The second segment defines the actual input and output patterns for each test. Program information can be generated from standard digital test procedures, truth tables, specification sheets, or the information can be generated by automatic test generation techniques. Programming of the PROM cards may be accomplished by conventional PROM programming equipment.

An illustrative test program for the simplified digital module schematic shown in FIG. 3, and which module includes logic components 44, 46 and 48, input pins designated as A and B and output pins designated as C and D is as follows:

|  | INSTRUCTION |  | DESCRIPTION |
|---|---|---|---|
| Initializing Parameters | CHS UID OPM NOT | P/N6810 3, 4 2 | Check Sum Unit identification number Output pin numbers are C, D Total number of tests: 2 |
| Test Number 1 | TNR TCW INP PIN B GOP | T1 IND, 2 0 Set Pin B to high (1) 1 | Test number 1 identifier Test control word, initialization pattern and one pin change Set all input pins to 0 Test for high (1) on Pins C and D. The tester executive verifies that Pins C and D are high (1). If Test 1 is passed, the tester continues to the nest test. |
|  | TNR TCW PIN PIN AB | T2 3 A Change pins AB | Test number 2 Test control word, three pin changes Set Pin A to high (1) |

| INSTRUCTION |  | DESCRIPTION |
|---|---|---|
| PIN GOP | AB CL, DH | Change pins AB again Test for low (0) on Pin C, Test for high (1) on Pin D |
| END |  | End of module test |

It will now be seen from the foregoing description of the invention that a portable electronic circuit tester has been disclosed which features integral test program procedures, solid state data storage, and internal verification of system integrity before and during program execution. The test can be used with simplified programming requirements and has an interactive display with a generalized digital interface. The invention is structured so that the program operating routines are permanently stored internal to the machine with external programming being required only for the program variables.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A system for testing electrical units, comprising:
 programmable memory means for storing a test program relating to a particular unit to be tested;
 executive memory means for storing an executive test program;
 a central processing unit connected to the programmable memory means for reading the test program stored therein, and connected to the executive memory means for executing the executive test program in accordance with the read test program;
 means connected to the central processing unit, the executive memory means and the unit to be tested, and controlled by the central processing unit for applying the executed executive test program to the unit to be tested; and
 indicating means connected to the programmable memory means, the executive memory means, the central processing unit and the means for applying the executed executive test program to the unit to be tested, and operable by all of said means for indicating test operating instructions and unit test status.

2. A system as described by claim 1, wherein the programmable memory means for storing a test program relating to a particular unit to be tested includes:
 an erasable programmable read only memory device storing test progam variable data in a predetermined test format.

3. A system as described by claim 2, wherein the executive memory means for storing an executive test program includes:
 an erasable programmable read only memory device storing program routines for the execution of a test program utilizing the test program variable data in a predetermined test format stored in the programmable memory means.

4. A system as described by claim 3, including:
 a random access memory device connected to the erasable programmable read only memory device for providing a scratch pad memory during execution of the test program.

5. A system as described by claim 1, wherein the means connected to the central processing unit, the executive memory means and the unit to be tested, and controlled by the control processing unit for applying the executed executive test program to the unit to be tested includes:
- a dual storage register arrangement including a data storage register and a data buffer register;
- a tri-state TTL compatible receiver-driver arrangement including a driver logic amplifier and a receiver logic amplifier;
- the central processing unit providing a first signal for enabling the data storage register to load and store executed executive test program data; and
- the central processing unit providing a second signal for enabling the data buffer register to receive the executed program data transferred from the data storage register and therefrom through the logic driver amplifier to the unit to be tested.

6. A system as described by claim 5, including:
means controlled by the central processing unit for controlling the driver amplifier so that said amplifier is in one appropriate mode of send, receive and input/output modes.

7. A system as described by claim 5, wherein:
the receiver amplifier is connected to the driver amplifier, with the executed program data received by the data buffer register and transferred therefrom through the driver amplifier to the unit to be tested being received by the receiver amplifier; and
the central processing unit separately connected to the receiver amplifier for reading the data received thereby.

* * * * *